(12) United States Patent
Chen

(10) Patent No.: US 9,653,231 B2
(45) Date of Patent: *May 16, 2017

(54) LUMINOUS KEYBOARD

(71) Applicant: Primax Electronics Ltd., Neihu, Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/087,574

(22) Filed: Mar. 31, 2016

(65) Prior Publication Data

US 2016/0217945 A1    Jul. 28, 2016

Related U.S. Application Data

(63) Continuation of application No. 13/920,243, filed on Jun. 18, 2013, now Pat. No. 9,331,692.

(30) Foreign Application Priority Data

Dec. 19, 2012  (TW) .............................. 101148416 A

(51) Int. Cl.
| | |
|---|---|
| *H01H 13/83* | (2006.01) |
| *H01H 3/12* | (2006.01) |
| *H03K 17/96* | (2006.01) |
| *H03K 17/98* | (2006.01) |

(52) U.S. Cl.
CPC ......... *H01H 13/83* (2013.01); *H03K 17/9622* (2013.01); *H03K 17/98* (2013.01); *H01H 2219/056* (2013.01); *H01H 2219/062* (2013.01); *H01H 2219/066* (2013.01); *H03K 2217/96079* (2013.01)

(58) Field of Classification Search
CPC .............................. H01H 13/83; H01H 3/125
USPC ................................... 200/5 A, 310–314, 344
See application file for complete search history.

(56) References Cited

U.S. PATENT DOCUMENTS

| | | | |
|---|---|---|---|
| 9,331,692 B2* | 5/2016 | Chen ....................... | H03K 17/98 |
| 2011/0272262 A1* | 11/2011 | Chen ....................... | H01H 13/83 |
| | | | 200/5 A |
| 2014/0166458 A1* | 6/2014 | Chen ................... | H03K 17/9622 |
| | | | 200/5 A |

* cited by examiner

*Primary Examiner* — Edwin A. Leon
*Assistant Examiner* — Ahmed Saeed
(74) *Attorney, Agent, or Firm* — Kirton McConkie; Evan R. Witt

(57) ABSTRACT

A luminous keyboard includes a lateral-emitting type illumination element, a light guide panel, a sensing circuit pattern, a light-transmissible substrate, a supporting plate, and plural keys. When one of the keys is moved toward the sensing circuit pattern, the sensing circuit pattern generates a corresponding non-contact key signal. The lateral-emitting type illumination element is used for providing a light beam to the light guide panel. Consequently, the light beam can be diffused to the whole light guide panel. The light guide panel has plural light-guiding dots for collecting and scattering the light beam. The light-transmissible substrate is arranged between the light guide panel and the plural keys, and has plural light diffusion structures corresponding to the plural keys. The light beam scattered upwardly by each light-guiding dot is sequentially transmitted through the corresponding light diffusion structure and the supporting plate and directed to the corresponding key.

15 Claims, 15 Drawing Sheets

LUMINOUS KEYBOARD

FIELD OF THE INVENTION

The present invention relates to a luminous keyboard, and more particularly to a luminous keyboard with an illuminating function.

BACKGROUND OF THE INVENTION

Recently, with the increasing development of information industries, portable information devices such as notebook computers, mobile phones or personal digital assistants are widely used in many instances. In case that a portable information device is used in a dim environment, the numbers and the characters marked on the keys of the keyboard of the portable information device are not clearly visible. In other words, the dim environment becomes hindrance from operating the keyboard. In addition, if the numbers and the characters marked on the keys of the keyboard are reluctantly viewed in the dim environment, the user is readily suffered from vision impairment. For solving these drawbacks, a luminous keyboard has been disclosed. The luminous keyboard can be used in the dim environment in order to enhance the applications thereof. Moreover, by changing the layout of the luminous regions of the luminous keyboard, the information device having the luminous keyboard is more aesthetically-pleasing and thus the competiveness thereof is enhanced.

FIG. 1 is a schematic cross-sectional view illustrating a conventional luminous keyboard. As shown in FIG. 1, the luminous keyboard 1 comprises a reflecting plate 11, a light guide plate 12, a supporting plate 13, a membrane wiring board 14, plural keys 15, and plural lateral-emitting type illumination elements 16. The membrane wiring board 14 comprises a lower wiring plate 141, an upper wiring plate 142, and an intermediate plate 143. The intermediate plate 143 is arranged between the lower wiring plate 141 and the upper wiring plate 142. The lower wiring plate 141, the intermediate plate 143 and the upper wiring plate 142 are all made of a transparent light-guiding material. The transparent light-guiding material is for example polycarbonate (PC) or polyethylene terephthalate (PET).

Please refer to FIG. 2, which is a schematic exploded view illustrating a membrane wiring board of the conventional luminous keyboard of FIG. 1. The lower wiring plate 141 comprises a first circuit pattern 1411. The first circuit pattern 1411 comprises plural silver paste conductor lines 14111 and plural lower contacts 14112. The upper wiring plate 142 comprises a second circuit pattern 1421. The second circuit pattern 1421 comprises plural silver paste conductor lines 14211 and plural upper contacts 14212. The intermediate plate 143 comprises plural perforations 1431 corresponding to the plural lower contacts 14112 and the plural upper contacts 14212, respectively. Each of the upper contacts 14212 and the corresponding lower contact 14112 are collectively defined as a membrane switch 144.

The supporting plate 13 is disposed under the membrane wiring board 14. In addition, the supporting plate 13 comprises plural openings 131, a first fixing structure 132, and a second fixing structure 133. Each of the keys 15 comprises a keycap 151, an elastic element 152, and a scissors-type connecting element 153. The keycap 151 comprises a first keycap connecting structure 1511 and a second keycap connecting structure 1512. The scissors-type connecting element 153 comprises a first frame 1531 and a second frame 1532. In addition, the elastic element 152 is arranged between the keycap 151 and the membrane wiring board 14.

The membrane wiring board 14 further comprises apertures 145 and 146 (see FIG. 1). The first fixing structure 132 and the second fixing structure 133 are penetrated through the apertures 145 and 146, respectively. A first end 15311 of the first frame 1531 is connected to the second fixing structure 133, and a second end 15312 of the first frame 1531 is connected to the first keycap connecting structure 1511. In addition, a first end 15321 of the second frame 1532 is connected to the first fixing structure 132, and a second end 15322 of the second frame 1532 is connected to the second keycap connecting structure 1512.

As any key 15 is depressed and moved downwardly relative to the supporting plate 13, the first frame 1531 and the second frame 1532 of the scissors-type connecting element 153 are switched from an open-scissors state to a folded state. Moreover, as the keycap 151 is moved downwardly to compress the elastic element 152, the corresponding upper contact 14212 is pushed by the elastic element 152. Consequently, the upper contact 14212 is penetrated through the corresponding perforation 1431 to be contacted with the corresponding lower contact 14112. Under this circumstance, the corresponding membrane switch 144 is electrically conducted, and thus the luminous keyboard 1 generates a corresponding key signal. When the depressing force exerted on the key 15 is eliminated, an elastic force provided by the elastic element 152 is acted on the keycap 151. In response to the elastic force, the keycap 151 is moved upwardly relative to the supporting plate 13. Under this circumstance, the first frame 1531 and the second frame 1532 of the scissors-type connecting element 153 are switched from the folded state to the open-scissors state, and the keycap 151 is returned to its original position.

Moreover, the lateral-emitting type illumination elements 16 are located at bilateral sides of the light guide plate 12 for emitting light beams. The light beams are incident into the light guide plate 12. The light guide plate 12 is disposed over the reflecting plate 11. Moreover, plural light-guiding dots 121 are formed on a bottom surface of the light guide plate 12 for collecting and scattering the light beams. The light-guiding dots 121 are aligned with corresponding keys 15. After the light beams are incident into the light guide plate 12, the light beams are diffused into the whole light guide plate 12. Due to the ink properties of the light-guiding dots 121, the light beams will be scattered upwardly and downwardly. The portions of the light beams that are scattered upwardly will be sequentially transmitted through the openings 131 of the supporting plate 13 and the membrane wiring board 14 and then projected to the plural keys 15. The portions of the light beams that are scattered downwardly will be reflected by the reflecting plate 11, and the reflected light beams are directed upwardly. Consequently, the light beams provided by the illumination elements 16 can be well utilized to illuminate the plural keys 15. However, the conventional luminous keyboard 1 still has the following drawbacks.

Firstly, since the luminous keyboard 1 comprises too many components, it is difficult to reduce the overall thickness of the luminous keyboard 1. In other words, the conventional luminous keyboard 1 fails to meet the requirements of light weightiness, slimness and miniaturization.

Secondly, since the travelling distance of the scissors-type connecting element 153 is long, the luminous keyboard 1 should have sufficient space to permit normal operations of the scissors-type connecting element 153. The necessary space is detrimental to the reduction of the thickness of the luminous keyboard 1. In other words, the conventional luminous keyboard 1 fails to meet the requirements of light weightiness, slimness and miniaturization.

Recently, a capacitive sensing keyboard was disclosed for solving the above drawbacks of the conventional luminous keyboard 1. As the keycap is depressed, the electric field of a capacitive key switch of a circuit board of the capacitive sensing keyboard is changed. Due to the change of the electric field, the circuit board generates a corresponding key signal. Since the scissors-type connecting element is not an essential component of the capacitive sensing keyboard, if the scissors-type connecting element is not used, the overall thickness of the capacitive sensing keyboard is effectively reduced. However, since the current capacitive sensing keyboard has no illuminating function, if the capacitive sensing keyboard is used in the dim environment, some problems may occur. For example, since the numbers and the characters marked on the keys of the capacitive sensing keyboard are not clearly visible, the dim environment becomes hindrance from operating the capacitive sensing keyboard or the user is readily suffered from vision impairment.

SUMMARY OF THE INVENTION

The present invention relates to a luminous keyboard, and more particularly to a luminous keyboard having enhanced light utilization efficiency and using a non-contact sensing technology.

In accordance with an aspect of the present invention, there is provided a luminous keyboard. The luminous keyboard includes a sensing circuit pattern, at least one key, a lateral-emitting type illumination element, a light guide panel, a supporting plate, and a light-transmissible substrate. The sensing circuit pattern is used for generating at least one non-contact key signal. When the at least one key is depressed, the at least one non-contact key signal is correspondingly generated by the sensing circuit pattern. The lateral-emitting type illumination element is used for providing a light beam. The lateral-emitting type illumination element is located at a lateral side of the light guide panel. The light guide panel has at least one light-guiding dot for collecting and scattering the light beam from the lateral-emitting type illumination element. The supporting plate is used for connecting and supporting the at least one key. The supporting plate has at least one light-transmissible part corresponding to the at least one key. The light-transmissible substrate is arranged between the supporting plate and the light guide panel. The light-transmissible substrate includes at least one light diffusion structure corresponding to the at least one key for changing an optical path of the light beam from the at least one light-guiding dot, so that the light beam from the at least one light-guiding dot is sequentially transmitted through the at least one light diffusion structure and the at least one light-transmissible part and then directed to the at least one key.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
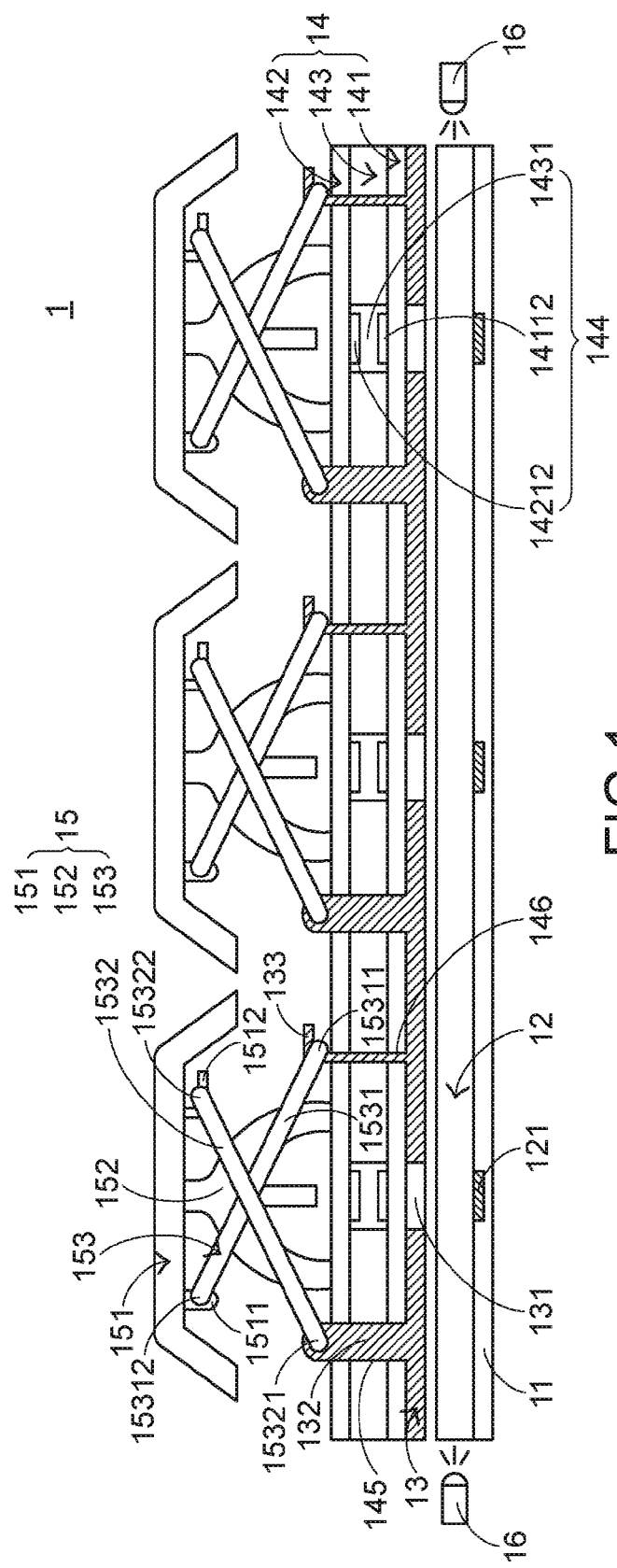
FIG. 1 is a schematic cross-sectional view illustrating a conventional luminous keyboard.
Figure 2:
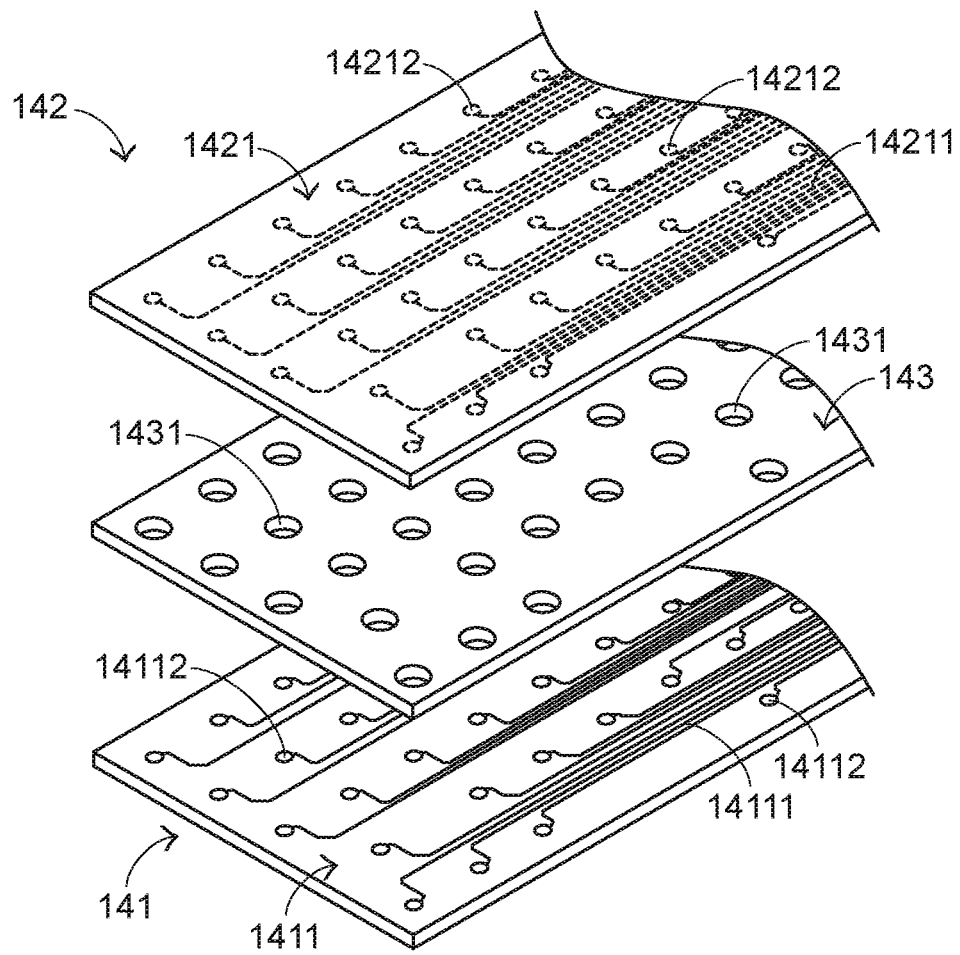
FIG. 2, which is a schematic exploded view illustrating a membrane wiring board of the conventional luminous keyboard of FIG. 1.
Figure 3:
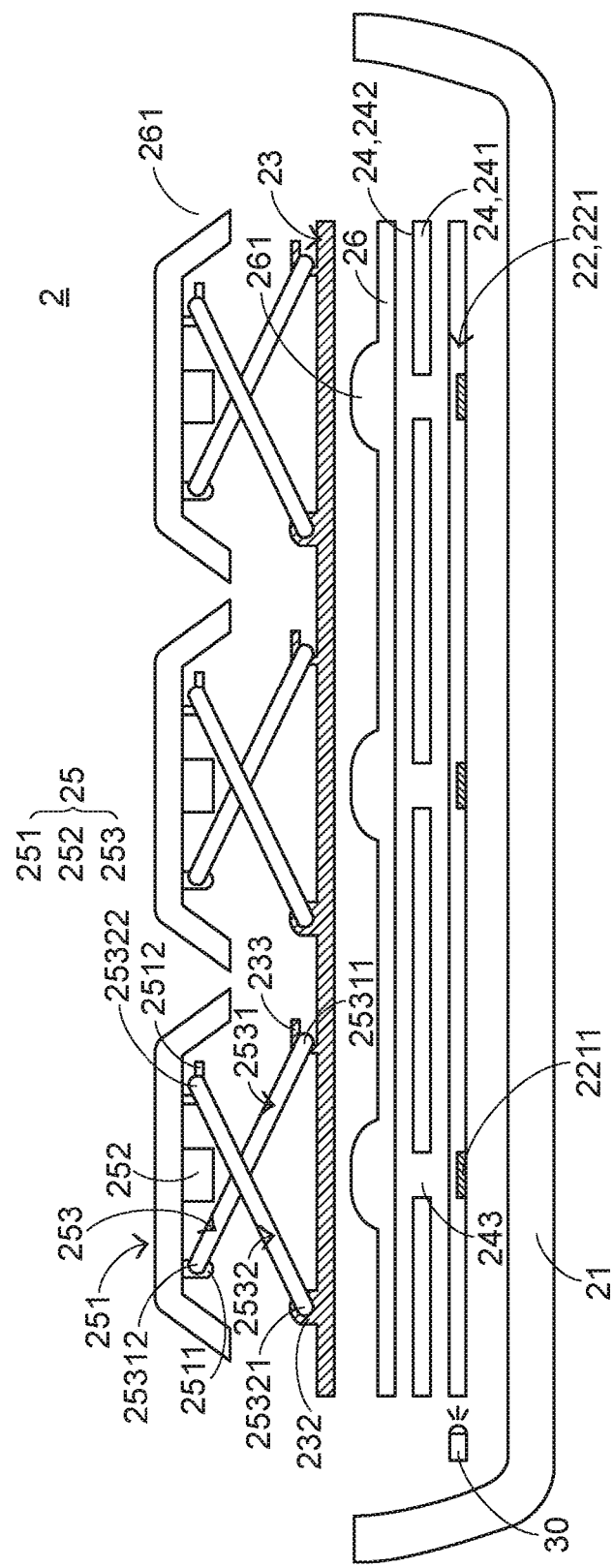
FIG. 3 is a schematic side view illustrating a luminous keyboard according to a first embodiment of the present invention.
Figure 4:
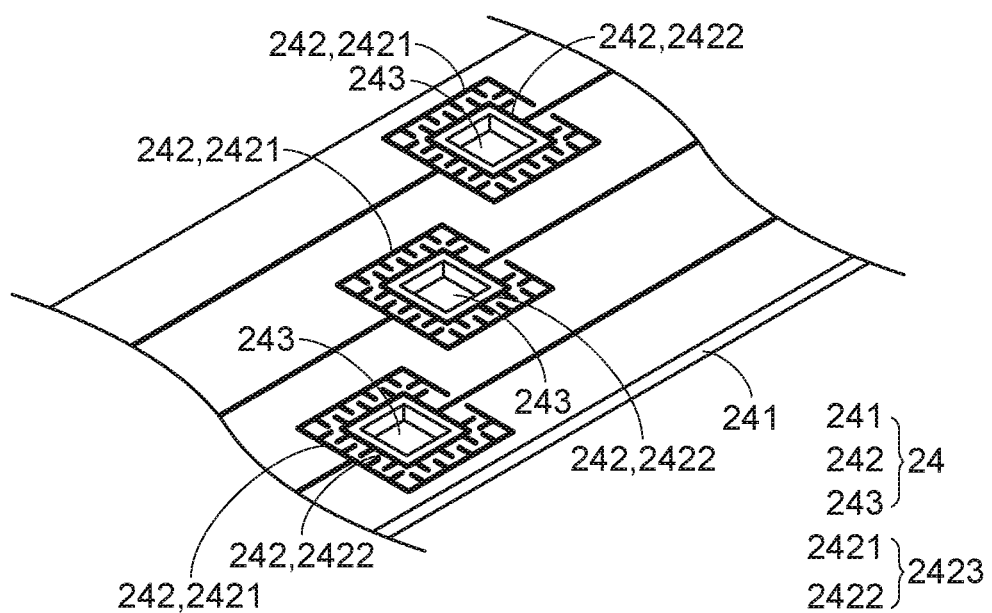
FIG. 4 is a schematic exploded view illustrating a sensing module of the luminous keyboard of FIG. 3.
Figure 5:
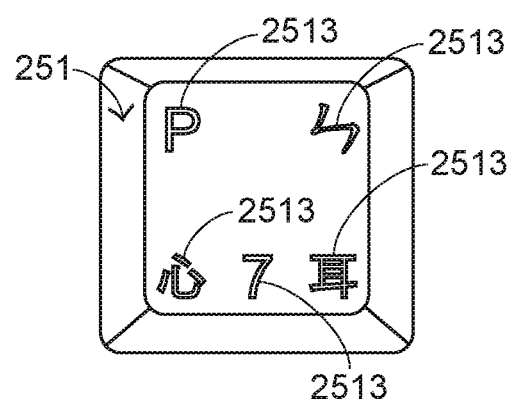
FIG. 5 is a schematic top view illustrating a keycap of the luminous keyboard of FIG. 3.

FIG. 3 is a schematic side view illustrating a luminous keyboard according to a first embodiment of the present invention. FIG. 4 is a schematic exploded view illustrating a sensing module of the luminous keyboard of FIG. 3. FIG. 5 is a schematic top view illustrating a keycap of the luminous keyboard of FIG. 3. Please refer to FIGS. 3, 4 and 5.

From bottom to top, a base 21, a light guide panel 22, a sensing module 24, a light-transmissible substrate 26, a supporting plate 23 and plural keys 25 of the luminous keyboard 2 are sequentially shown. The luminous keyboard 2 further comprises a lateral-emitting type illumination element 30. The lateral-emitting type illumination element 30 is located at a lateral side of the light guide panel 22. The base 21 is used for supporting the light guide panel 22, the sensing module 24, the supporting plate 23, the plural keys 25 and the lateral-emitting type illumination element 30.

The supporting plate 23 is used for connecting and supporting the plural keys 25. Each key 25 comprises a keycap 251, a conductive element 252, and a connecting element 253. Each connecting element 253 is arranged between the supporting plate 23 and the corresponding keycap 251 for connecting the supporting plate 23 and the corresponding keycap 251. Moreover, due to the connecting element 253, the keycap 251 is movable upwardly or downwardly relative to the supporting plate 23. Each conductive element 252 is connected to a bottom surface of the corresponding keycap 251, and movable relative to the corresponding keycap 251. The conductive element 252 is made of conductive material. An example of the conductive material includes but is not limited to conductive foam, metallic material, graphite or metallic paint. Moreover, the keycap 251 comprises at least one light-outputting region 2513. For example, the light-outputting region 2513 is a light-outputting symbol region, a light-outputting number region or a light-outputting character region.

Moreover, in this embodiment, the lateral-emitting type illumination element 30 is a light emitting diode. Moreover, the light guide panel 22 comprises a light guide plate 221. The light guide plate 22 is made of polyethylene terephthalate (PET), polycarbonate (PC), thermoplastic polyurethane (TPU) or polymethylmethacrylate (PMMA), but is not limited thereto. The lateral-emitting type illumination element 30 is used for emitting a light beam. The light beam is incident into the light guide plate 221. Moreover, plural light-guiding dots 2211 are formed on a surface of the light guide plate 221 for collecting and scattering the light beam. The light-guiding dots 2211 are aligned with corresponding keys 25, respectively. After the light beam is incident into the light guide plate 221, the light beam is diffused into the whole light guide plate 221. Due to the properties (e.g. the ink properties) or the structures (e.g. microstructures) of the plural light-guiding dots 2211, the light beam will be scattered upwardly and downwardly.

In this embodiment, the supporting plate 23 is a light-transmissible supporting plate. For example, the supporting plate 23 is made of a light-transmissible material. The portion of the light beam that is scattered upwardly by the plural light-guiding dots 2211 will be sequentially transmitted through the light-transmissible substrate 26 and the supporting plate 23 and directed to the plural keys 25, and then outputted from the light-outputting region 2513 of the keycap 251. Under this circumstance, the illuminated symbol, number or character of the key 25 can be clearly viewed by the user, and thus the operating difficulty in the dim environment can be minimized.

Generally, the light-outputting region 2513 is located at a corner of the keycap 251. However, since the distance between the supporting plate 23 and the keycap 251 is too short, the light beam passing through the supporting plate 23 fails to be effectively refracted to the light-outputting region 2513 at the corner of the keycap 251. In other words, a greater portion of the light beam is directed to the middle region of the keycap 251. Under this circumstance, the light utilization efficiency is still unsatisfied.

For increasing the light utilization efficiency, the light-transmissible substrate 26 further comprises plural light diffusion structures 261. The plural light diffusion structures 261 are aligned with respective keycaps 251, and integrally formed with the light-transmissible substrate 26. In particular, the profile of each light diffusion structure 261 should be specially designed. Consequently, the light diffusion structure 261 has a lens profile. For example, the lens profile is a convex-concave lens profile, but is not limited thereto. That is, by specially designing the profile of the light diffusion structure 261, the light diffusion structure 261 has the lens function. Consequently, after the light beam is transmitted through the light diffusion structure 261, the optical path of the light beam is changed. That is, the light beam passing through the light diffusion structure 261 can be directed toward the light-outputting region 2513 of the keycap 251. The above way of diffusing the light beam to the light-outputting region 2513 of the keycap 251 by the light diffusion structure 261 is presented herein for purpose of illustration and description only. However, those skilled in the art will readily observe that numerous modifications and alterations of the light diffusion structure 261 may be made according to the practical requirements.

Figure 6:
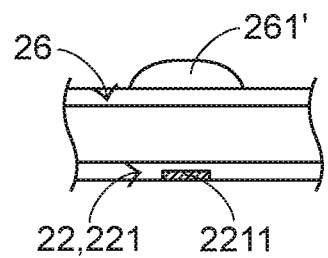
FIG. 6 schematically illustrates an example of a light diffusion structure used in the luminous keyboard of the present invention.

FIG. 6 schematically illustrates an example of a light diffusion structure used in the luminous keyboard of the present invention. For diffusing the light beam to the light-outputting region 2513 of the keycap 251, the light-transmissible substrate 26 comprises plural light diffusion structures 261' corresponding to the plural keycaps 251. In this embodiment, each of the light diffusion structures 261' is a lens. After the light beam is transmitted through the light-transmissible substrate 26, the light beam is transmitted through the light diffusion structure 261' (i.e. the lens), and thus the optical path of the light beam is changed. That is, the light beam passing through the light diffusion structures 261' can be directed toward the light-outputting region 2513 of the keycap 251.

Figure 7:
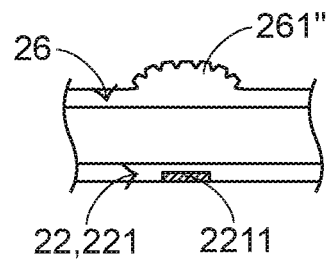
FIG. 7 schematically illustrates another example of a light diffusion structure used in the luminous keyboard of the present invention.
Figure 8:
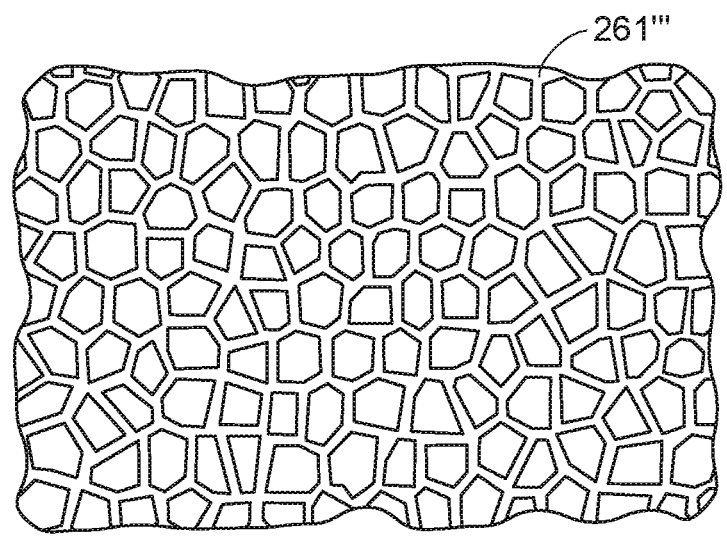
FIG. 8 schematically illustrates a further example of a light diffusion structure used in the luminous keyboard of the present invention.

FIG. 7 schematically illustrates another example of a light diffusion structure used in the luminous keyboard of the present invention. For diffusing the light beam to the light-outputting region 2513 of the keycap 251, the light-transmissible substrate 26 comprises plural light diffusion structures 261" corresponding to the plural keycap 251. In this embodiment, each of the light diffusion structures 261" comprises plural microstructures. After the light beam is transmitted through the light diffusion structure 261" (i.e. the microstructures 272), the optical path of the light beam is changed by the microstructures 272. That is, the light beam passing through the light diffusion structures 261" can be directed toward the light-outputting region 2513 of the keycap 251. As shown in FIG. 7, the microstructures are V-cut structures. However, the microstructures are not restricted to the V-cut structures. For example, as shown in FIG. 8, the microstructures of the light diffusion structures 261'" are texturing structures. The above examples of the light diffusion structures for diffusing the light beam to the light-outputting region 2513 of the keycap 251 are presented herein for purpose of illustration and description only, but are not used to limit the scope of the present invention.

Please refer to FIGS. 3 and 4 again. In this embodiment, the luminous keyboard 2 is a capacitive luminous keyboard, and the sensing module 24 is a capacitive sensing module. The sensing module 24 comprises a sensing circuit board 241 and a sensing circuit pattern 242. The sensing circuit pattern 242 is formed on a top surface or a bottom surface of the sensing circuit board 241. In this embodiment, the sensing circuit pattern 242 is formed on the top surface of the sensing circuit board 241.

For example, the sensing circuit board 241 is a printed circuit board with an insulated metal substrate (e.g. the conventional printed circuit board), but is not limited thereto. The sensing circuit pattern 242 comprises plural first electrode patterns 2421 and plural second electrode patterns 2422 corresponding to the plural first electrode patterns 2421, respectively. Each of the plural first electrode patterns 2421 and the corresponding second electrode pattern 2422 are separated from each other by a gap. Moreover, each of the plural first electrode patterns 2421 and the corresponding second electrode pattern 2422 are collaboratively defined as a capacitive key switch 2423. When the sensing module 24 is electrically conducted, plural electric fields between the first electrode patterns 2421 and the corresponding second electrode patterns 2422 are generated. If one of the electric fields is changed, the corresponding capacitive key switch 2423 is triggered, so that the sensing module 24 generates a non-contact key signal. Moreover, the sensing module 24 further comprises plural perforations 243 corresponding to the plural light-guiding dots 2211, respectively. The portion of the light beam that is scattered upwardly may be transmitted through the plural perforations 243.

In this embodiment, each first electrode pattern 2421 and the corresponding second electrode pattern 2422 are discretely arranged on the same horizontal plane. It is noted that numerous modifications and alterations may be made while retaining the teachings of the invention. For example, in some embodiments, each first electrode pattern 2421 and the corresponding second electrode pattern 2422 may be discretely arranged on different horizontal planes. That is, each first electrode pattern 2421 may be disposed over or under the corresponding second electrode pattern 2422. Moreover, a spacer layer (e.g. an UV adhesive layer) is coated or printed on the region between each first electrode pattern 2421 and the corresponding second electrode pattern 2422. Consequently, each first electrode pattern 2421 and the corresponding second electrode pattern 2422 are separated from each other vertically.

The way of generating the key signal in the capacitive sensing manner and the operating principle thereof are well known to those skilled in the art, and are not redundantly described herein. The configuration of the sensing circuit pattern 242 of FIG. 4 is presented herein for purpose of illustration and description only. It is noted that numerous modifications and alterations of the sensing circuit pattern 242 may be made while retaining the teachings of the invention. For example, in some other embodiments, the sensing circuit pattern 242 may be a magnetic sensing circuit pattern or any other comparable non-contact sensing circuit pattern.

In this embodiment, the connecting element 253 of each key 25 is a scissors-type connecting element. Moreover, the scissors-type connecting element 253 comprises a first frame 2531 and a second frame 2532. The supporting plate 23 further comprises a first fixing structure 232 and a second fixing structure 233. The keycap 251 of each key 25 comprises a first keycap connecting structure 2511 and a second keycap connecting structure 2512. A first end 25311 of the first frame 2531 is connected to the second fixing structure 233, and a second end 25312 of the first frame 2531 is connected to the first keycap connecting structure 2511. In addition, a first end 25321 of the second frame 2532 is connected to the first fixing structure 232, and a second end 25322 of the second frame 2532 is connected to the second keycap connecting structure 2512. It is noted that the connection relationships between the connecting element 253, the supporting plate 23 and the keycap 251 are presented herein for purpose of illustration and description only.

Moreover, the plural keys 25 are aligned with the plural capacitive key switches 2423, respectively. As any keycap 251 is depressed and moved downwardly relative to the supporting plate 23, the first frame 2531 and the second frame 2532 of the corresponding connecting element 253 are switched from an open-scissors state to a folded state. Moreover, as the keycap 251 is moved downwardly, the corresponding conductive element 252 is moved toward the sensing circuit pattern 242. Under this circumstance, the electric field between the corresponding first electrode pattern 2421 and the corresponding second electrode pattern 2422 is changed. Due to the change of the electric field, the corresponding capacitive key switch 2423 is triggered. Consequently, the sensing module 24 generates the corresponding non-contact key signal.

In this embodiment, the luminous keyboard 2 further comprises a keycap-restoring means (not shown). When the depressing force exerted on the keycap 251 is eliminated, the keycap 251 is moved upwardly relative to the sensing module 24 in response to the keycap-restoring means. Under this circumstance, the first frame 2531 and the second frame 2532 are switched from the folded state to the open-scissors state, and the keycap 251 is returned to its original position. Moreover, the keycap-restoring means can also provide a feedback tactile feel of depressing the keycap 251 to the user. In this embodiment, the keycap-restoring means is an elastic force or a magnetic force. That is, the keycap 251 is returned to its original position in response to the elastic force or the magnetic force. The way of generating the elastic force or the magnetic force is well known to those skilled in the art, and is not redundantly described herein.

Figure 9:
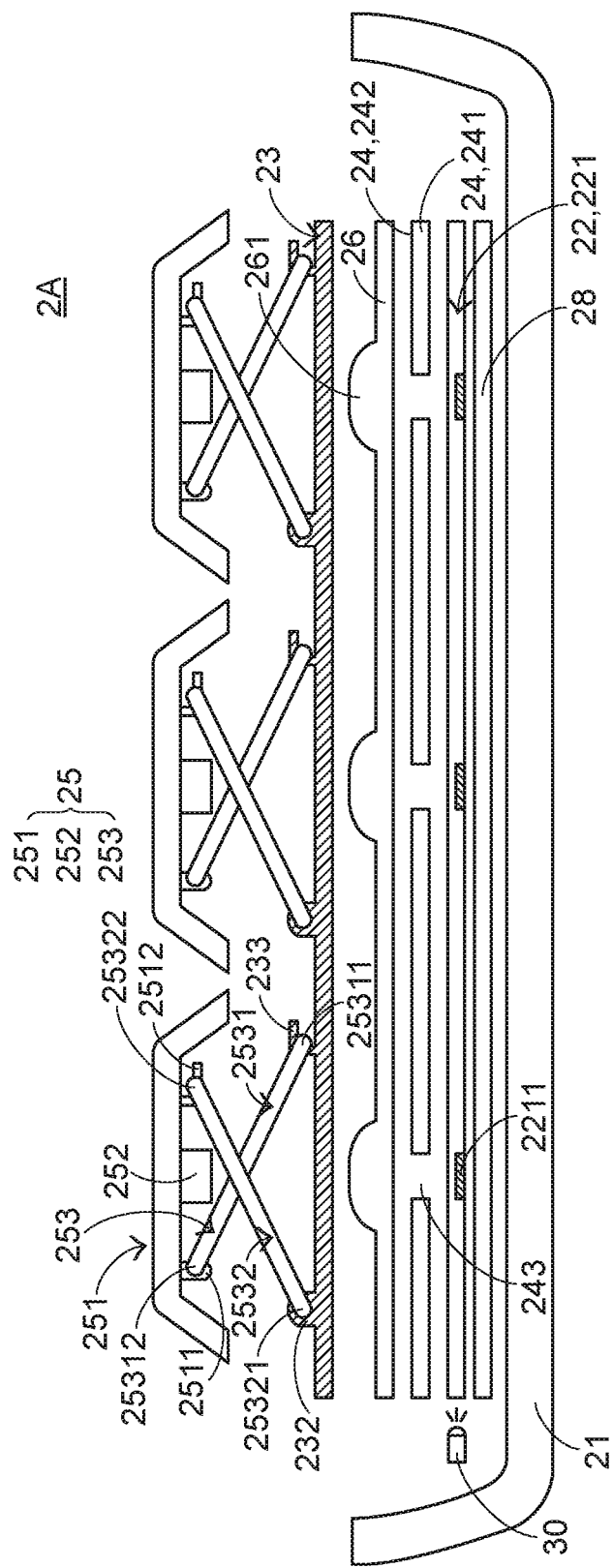
FIG. 9 is a schematic side view illustrating a luminous keyboard according to a second embodiment of the present invention.

FIG. 9 is a schematic side view illustrating a luminous keyboard according to a second embodiment of the present invention. Except that the luminous keyboard 2A of this embodiment further comprises a metallic bottom plate 28, the other components of the luminous keyboard 2A are similar to those of the luminous keyboard of the first embodiment, and are not redundantly described herein. The metallic bottom plate 28 is disposed under the sensing circuit pattern 242 for providing a shielding effect. Due to the shielding effect, the interference between the electric fields of every two adjacent capacitive key switches 2423 can be inhibited.

Those skilled in the art will readily observe that the metallic bottom plate 28 of the luminous keyboard of the second embodiment may be applied to the luminous keyboards of the following embodiments while retaining the teachings of the second embodiment of the present invention.

Figure 10:
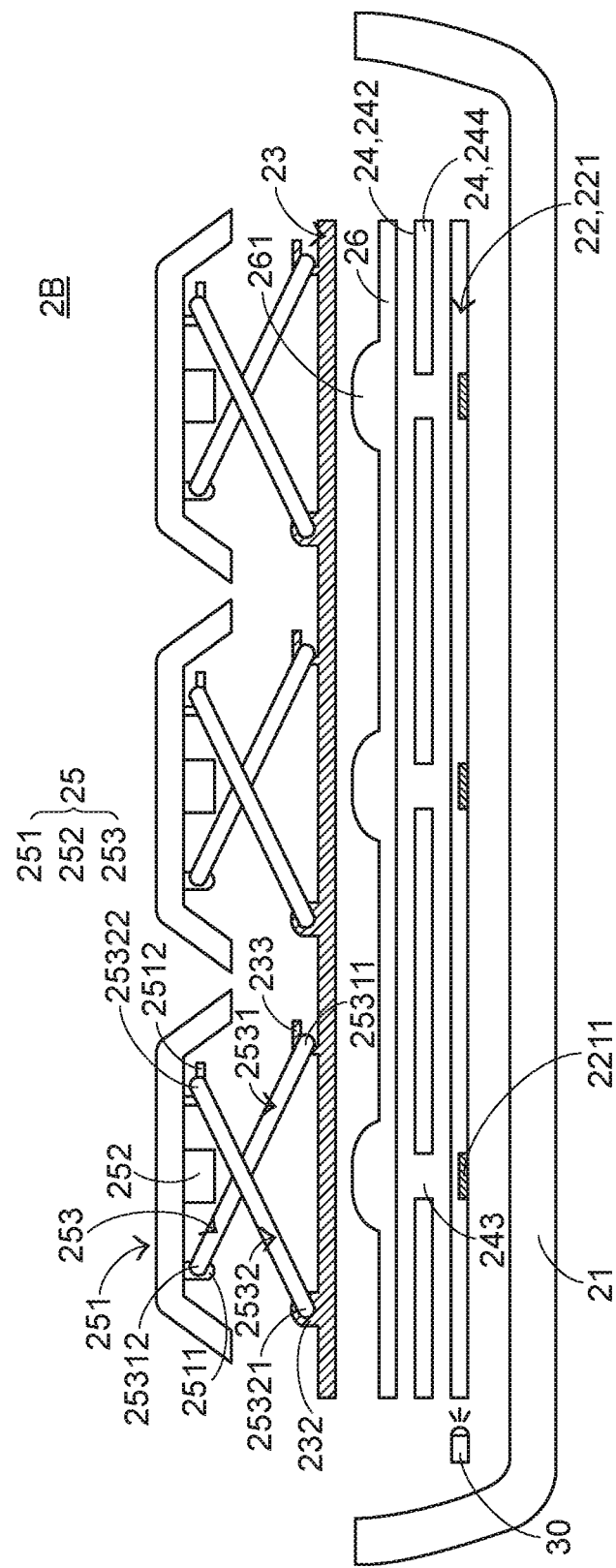
FIG. 10 is a schematic cross-sectional view illustrating a luminous keyboard according to a third embodiment of the present invention.

FIG. 10 is a schematic cross-sectional view illustrating a luminous keyboard according to a third embodiment of the present invention. Except that the luminous keyboard 2B of this embodiment comprises a sensing membrane wiring board 244 in replace of the sensing circuit board 241 of the first embodiment, the other components of the luminous keyboard 2B are similar to those of the luminous keyboard of the first embodiment, and are not redundantly described herein. Preferably, the sensing membrane wiring board 244 is made of polyethylene terephthalate (PET), polycarbonate (PC), thermoplastic polyurethane (TPU) or polymethylmethacrylate (PMMA), but is not limited thereto. Moreover, since the sensing membrane wiring board 244 is made of the light-transmissible material, the perforations 243 are not essential components for limiting the scopes of the present invention.

Those skilled in the art will readily observe that the sensing membrane wiring board 244 of the luminous keyboard of the third embodiment may be applied to the luminous keyboards of the above embodiments and the following embodiments while retaining the teachings of the third embodiment of the present invention.

Figure 11:
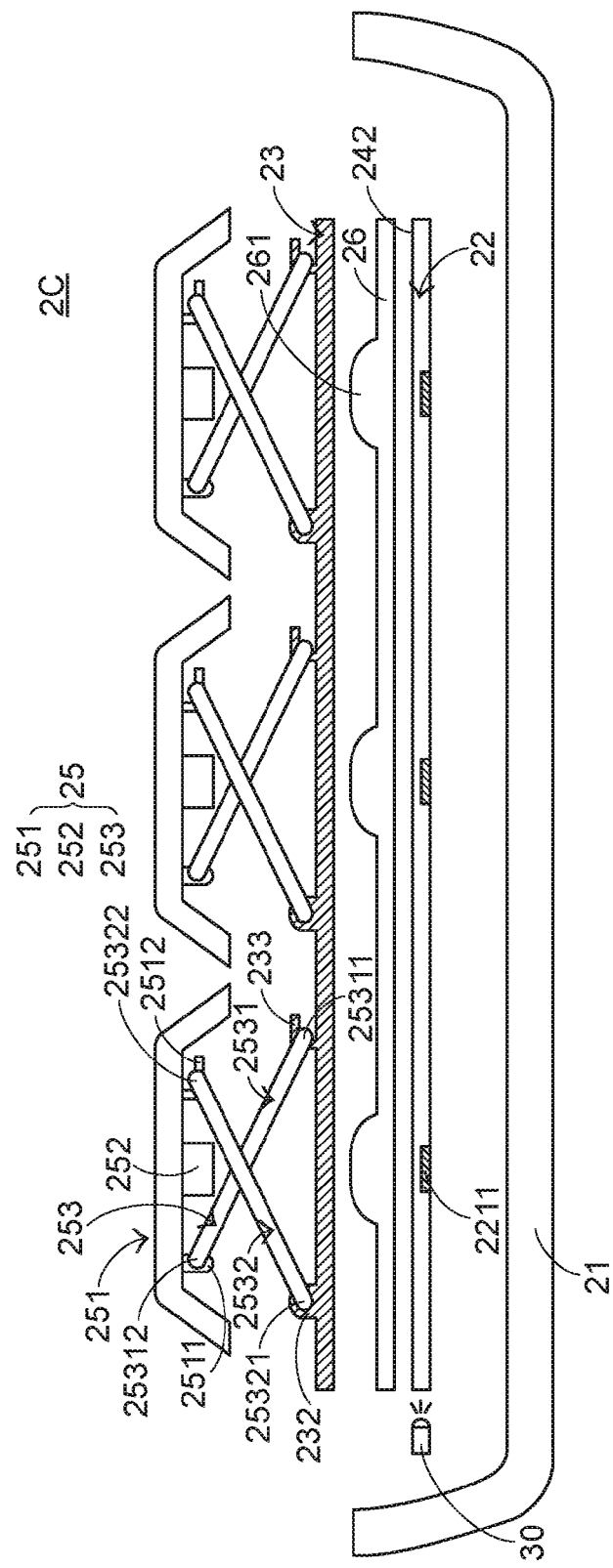
FIG. 11 is a schematic side view illustrating a luminous keyboard according to a fourth embodiment of the present invention.

FIG. 11 is a schematic side view illustrating a luminous keyboard according to a fourth embodiment of the present invention. In comparison with the luminous keyboard of the first embodiment, the sensing circuit pattern 242 of the luminous keyboard 2C of this embodiment is directly formed on a top surface of the light guide panel 22, and the sensing circuit board 241 is not included in the luminous keyboard 2C. The other components of the luminous keyboard 2C of this embodiment are similar to those of the luminous keyboard of the first embodiment, and are not redundantly described herein. Moreover, for illustration, the sensing circuit pattern 242 is formed on the top surface of the light guide panel 22. It is noted that numerous modifications and alterations may be made while retaining the teachings of the invention. For example, the sensing circuit pattern 242 may be formed on a bottom surface of the light guide panel 22 or within the light guide panel 22.

Those skilled in the art will readily observe that the relationships of the components of the luminous keyboard of the fourth embodiment may be applied to the luminous keyboards of the above embodiments and the following embodiments while retaining the teachings of the fourth embodiment of the present invention.

Figure 12:
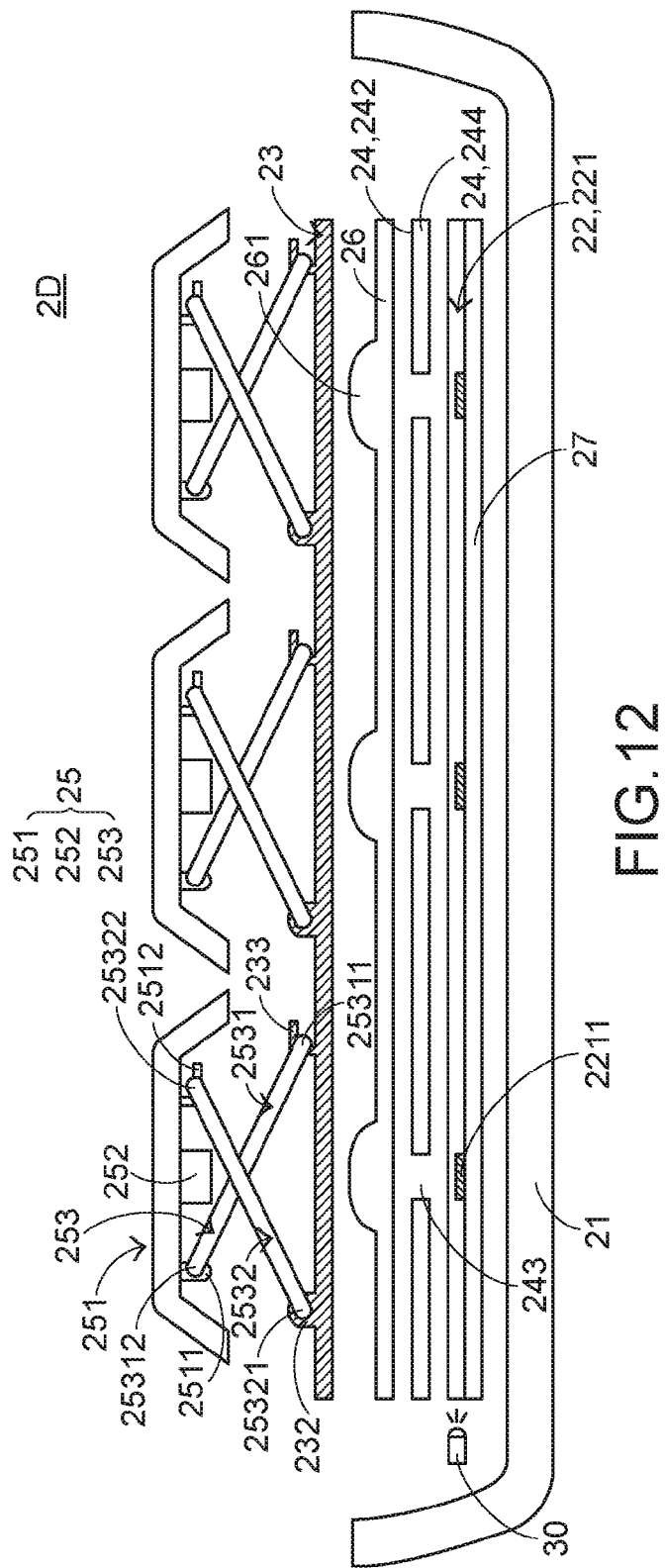
FIG. 12 is a schematic side view illustrating a luminous keyboard according to a fifth embodiment of the present invention.

FIG. 12 is a schematic side view illustrating a luminous keyboard according to a fifth embodiment of the present invention. Except that the luminous keyboard 2D of this embodiment further comprises a reflective layer 27, the other components of the luminous keyboard 2A are similar to those of the luminous keyboard of the third embodiment, and are not redundantly described herein. The reflective plate 27 is disposed under the light guide panel 22. The portion of the light beam that is scattered downwardly by the plural light-guiding dots 2211 is projected to the reflective plate 27 and reflected by the reflective plate 27. The reflected light beam is incident into the light guide panel 22 again. Since the portion of the light beam that is provided by the lateral-emitting type illumination element 30 and scattered downwardly by the plural light-guiding dots 2211 is not lost, the light beam can be well utilized. Under this circumstance, the light utilization efficiency of the luminous keyboard 2D is enhanced.

Those skilled in the art will readily observe that the reflective plate 27 of the luminous keyboard of the fifth embodiment may be applied to the luminous keyboards of the above embodiments and the following embodiments while retaining the teachings of the fifth embodiment of the present invention.

Figure 13:
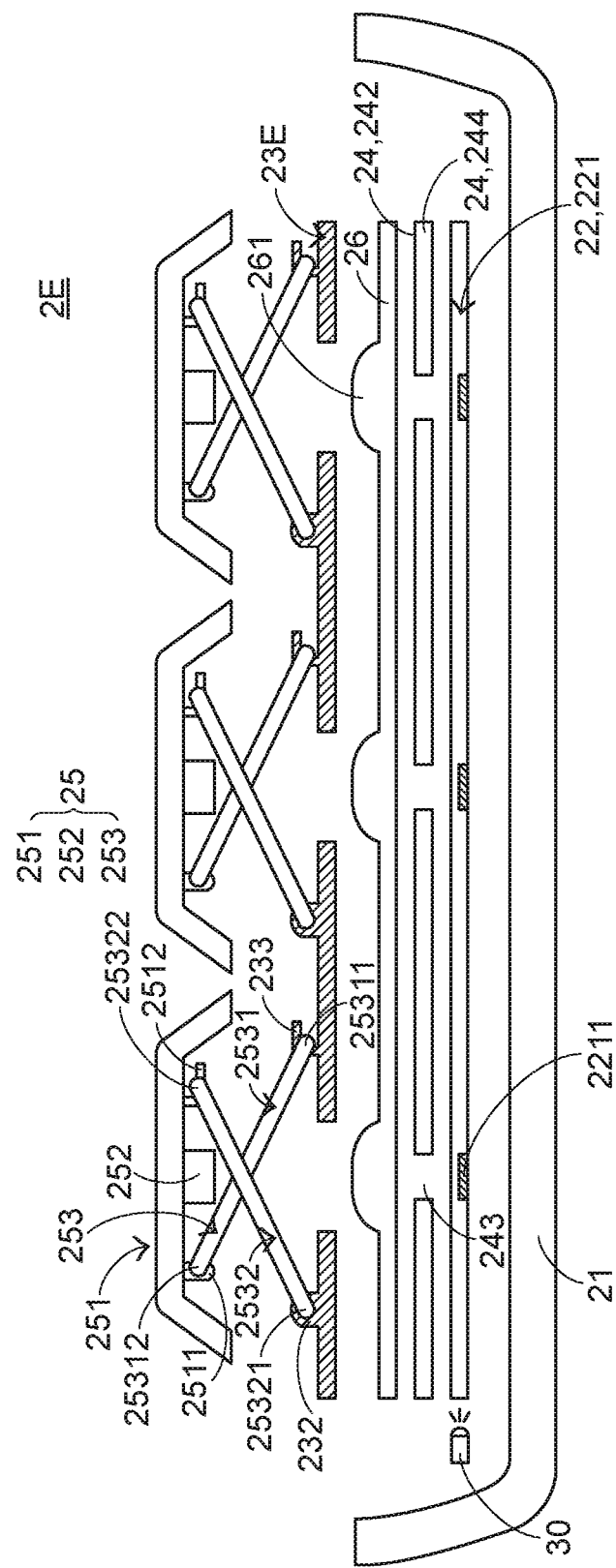
FIG. 13 is a schematic side view illustrating a luminous keyboard according to a sixth embodiment of the present invention.

FIG. 13 is a schematic side view illustrating a luminous keyboard according to a sixth embodiment of the present invention. Except that the supporting plate 23E of the luminous keyboard 2E of this embodiment is an opaque supporting plate and the supporting plate 23E has plural openings corresponding to the plural keys 25, the other components of the luminous keyboard 2E are similar to those of the luminous keyboard of the third embodiment, and are not redundantly described herein. The light beam passing through the light diffusion structures 261 is transmitted through the openings and directed toward the light-outputting region 2513 of the keycap 251.

Those skilled in the art will readily observe that the supporting plate 23E of the luminous keyboard of the sixth embodiment may be applied to the luminous keyboards of the above embodiments and the following embodiments while retaining the teachings of the sixth embodiment of the present invention.

In the above embodiments, the cooperation of the supporting plate 23 or 23E and the scissors-type connecting element 253 allows the keycap 251 and the conductive element 252 to be moved upwardly or downwardly relative to the sensing circuit pattern 24. The way of allowing the keycap 251 and the conductive element 252 to be moved upwardly or downwardly relative to the sensing circuit pattern 242 is presented herein for purpose of illustration and description only. However, those skilled in the art will readily observe that numerous modifications and alterations may be made according to the practical requirements. It is noted that the scissors-type connecting element 253 is not an essential component for limiting the scopes of the present invention.

Figure 14:
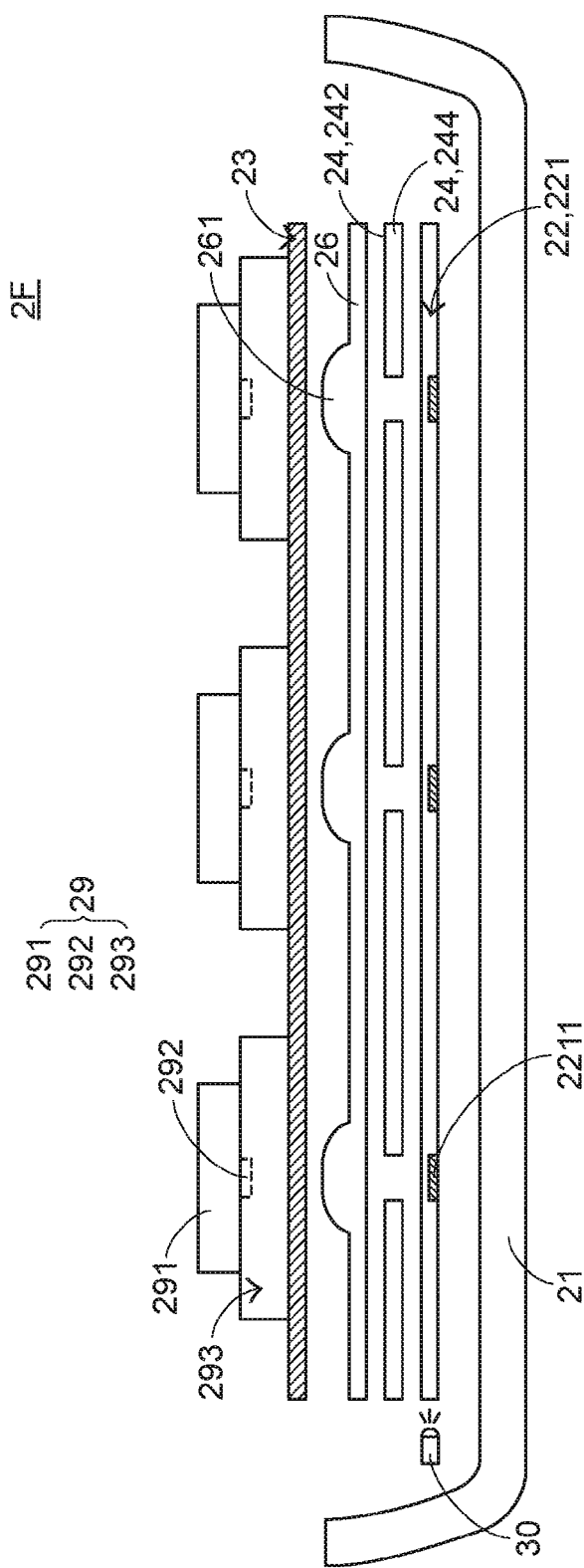
FIG. 14 is a schematic side view illustrating a luminous keyboard according to a seventh embodiment of the present invention.
Figure 15:
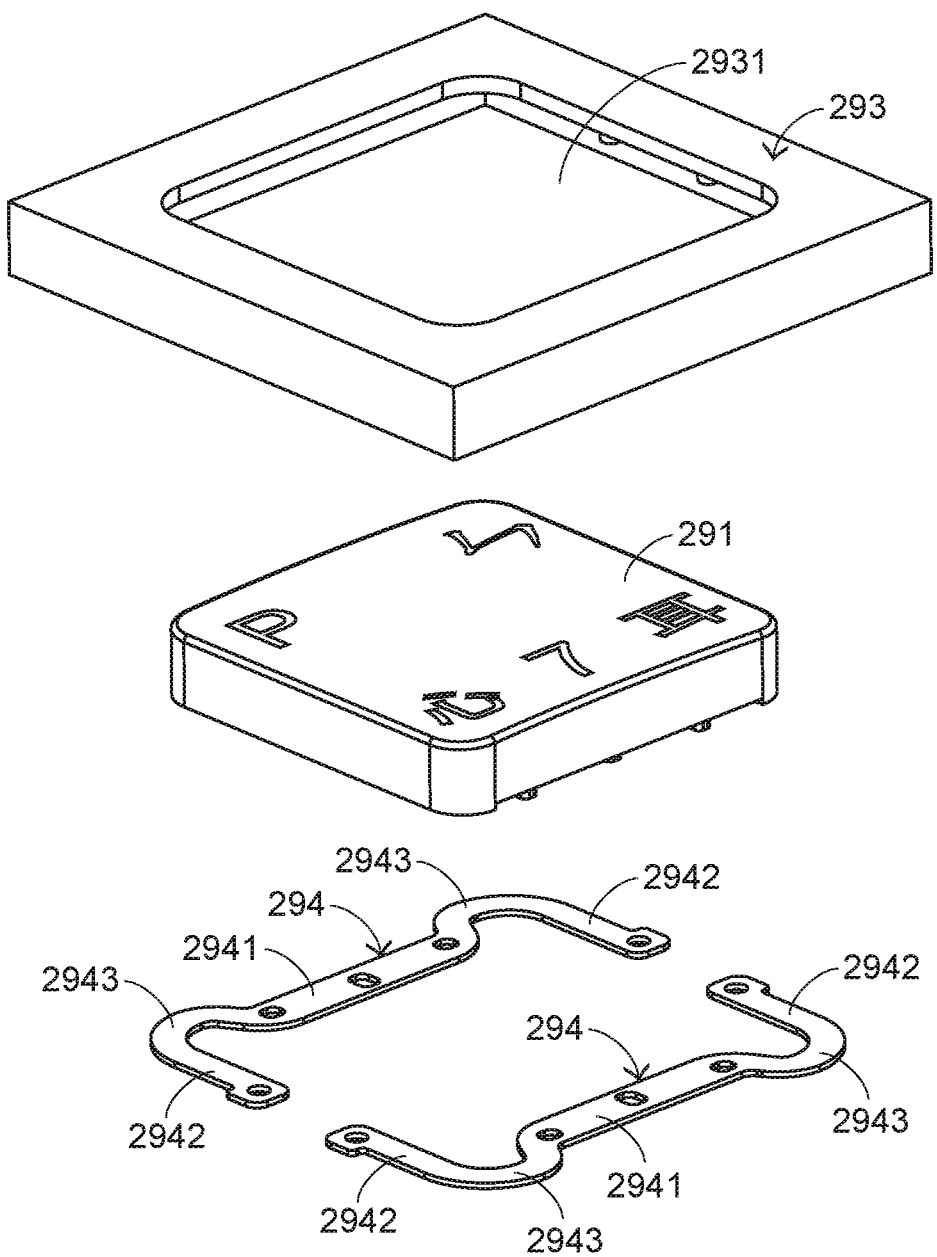
FIG. 15 is a schematic exploded view illustrating a key of the luminous keyboard of FIG. 14.
Figure 16:
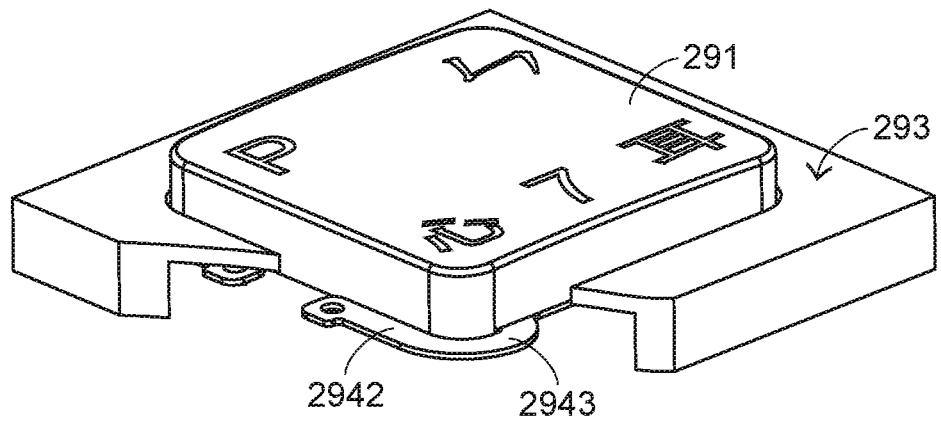
FIG. 16 is a schematic cutaway view illustrating the key of the luminous keyboard of FIG. 14, in which the key is not depressed.
Figure 17:
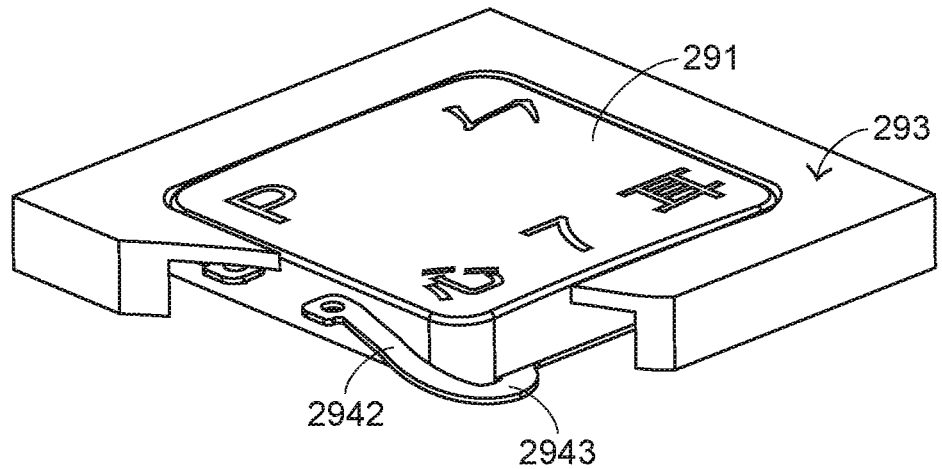
FIG. 17 is a schematic cutaway view illustrating the key of the luminous keyboard of FIG. 14, in which the key is depressed.

Hereinafter, another embodiment of a luminous keyboard will be illustrated with reference to FIGS. 14-47. FIG. 14 is a schematic side view illustrating a luminous keyboard according to a seventh embodiment of the present invention. FIG. 15 is a schematic exploded view illustrating a key of the luminous keyboard of FIG. 14. FIG. 16 is a schematic cutaway view illustrating the key of the luminous keyboard of FIG. 14, in which the key is not depressed. FIG. 17 is a schematic cutaway view illustrating the key of the luminous keyboard of FIG. 14, in which the key is depressed. Except for the following items, the other components of the luminous keyboard 2F of this embodiment are similar to those of the luminous keyboard of the third embodiment, and are not redundantly described herein.

In comparison with the third embodiment, the scissors-type connecting element 253 is not included in the luminous keyboard 2F of this embodiment. Especially, each key 29 comprises a keycap 291, a conductive element 292, a key frame 293, and plural elastic arms 294. Each of the elastic arms 294 is a flat strip comprising a static inner arm part 2941, a movable outer arm part 2942 and an angular transition part 2943. The movable outer arm part 2942 is perpendicular to the static inner arm part 2941. The angular transition part 2943 is connected between the static inner arm part 2941 and the movable outer arm part 2942. The key frame 293 has a hollow portion 2931. The keycap 291 is embedded into the hollow portion 2931 of the key frame 293. The static inner arm part 2941 of each elastic arm 294 is fixed on the bottom of the keycap 291. The movable outer arm part 2942 of each elastic arm 294 is exposed externally from the bottom of the keycap 291 and fixed on the key frame 293. The angular transition part 2943 of each elastic arm 294 is exposed externally from a corner of the bottom of the keycap 291.

In case that any keycap 291 is not depressed, the movable outer arm part 2942 and the angular transition part 2943 of each elastic arm 294 are not subjected to deformation (see FIG. 16). As any keycap 291 is depressed, the angular transition part 2943 of the elastic arm 294 is pressed by the corner of the bottom of the keycap 291. Under this circumstance, both of the movable outer arm part 2942 and the angular transition part 2943 of the elastic arm 294 are subjected to deformation (see FIG. 17). Moreover, as the keycap 291 is moved downwardly, the conductive element 292 is correspondingly moved toward the sensing circuit pattern 242. Meanwhile, the corresponding capacitive key switch is triggered, and thus the sensing circuit pattern 242 generates the corresponding non-contact key signal. For clarification and brevity, the capacitive key switch is not shown. The operations of the capacitive key switch are similar to those of the first embodiment, and are not redundantly described herein. When the depressing force exerted on the keycap 291 is eliminated, an elastic force provided by the corresponding elastic arm 294 is acted on the keycap 291. In response to the elastic force, the keycap 291 is returned to its original position.

In the luminous keyboard 2F of this embodiment, the scissors-type connecting element is not included, but the keycap and the conductive element are movable upwardly or downwardly relative to the sensing circuit pattern. Under this circumstance, the overall thickness of the luminous keyboard can be further reduced. The luminous keyboard is presented herein for purpose of illustration and description only. However, those skilled in the art will readily observe that the key structure of the seventh embodiment may be applied to the luminous keyboards of the above embodiments and the following embodiments while retaining the teachings of the seventh embodiment of the present invention.

Figure 18:
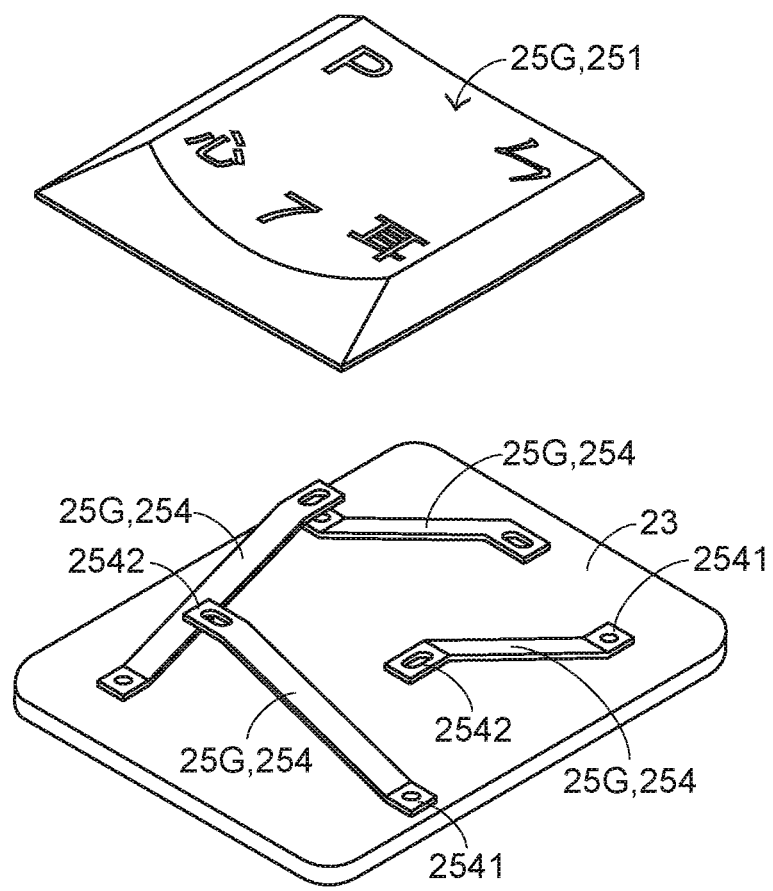
FIG. 18 is a schematic exploded view illustrating a key and a supporting plate of a luminous keyboard according to an eighth embodiment of the present invention.

FIG. 18 is a schematic exploded view illustrating a key and a supporting plate of a luminous keyboard according to an eighth embodiment of the present invention. Except for the following items, the other components of the luminous keyboard of this embodiment are similar to those of the luminous keyboard of the first embodiment, and are not redundantly described herein.

In comparison with the first embodiment, the scissors-type connecting element 253 is not included in the luminous keyboard of the eighth embodiment. Moreover, each key 25G further comprises plural elastic arms 254. The plural elastic arms 254 are arranged between the keycap 251 and the supporting plate 23. Each elastic arm 254 comprises a fixed end 2541 and a free end 2542. The fixed end 2541 of each elastic arm 254 is connected with the supporting plate 23. The free end 2542 of each elastic arm 254 is connected with the bottom of the keycap 251. As any keycap 251 is depressed, the free end 2542 of each elastic arm 254 is pressed by the keycap 251. Under this circumstance, the free end 2542 of each elastic arm 254 is moved downwardly with the keycap 251, and the free end 2542 of each elastic arm 254 provides an elastic force to the keycap 251. When the depressing force exerted on the keycap 251 is eliminated, the keycap 251 is returned to its original position in response to the elastic force provided by each elastic arm 254.

However, those skilled in the art will readily observe that the key structure of the eighth embodiment may be applied to the luminous keyboards of the above embodiments and the following embodiments while retaining the teachings of the eighth embodiment of the present invention.

Figure 19:
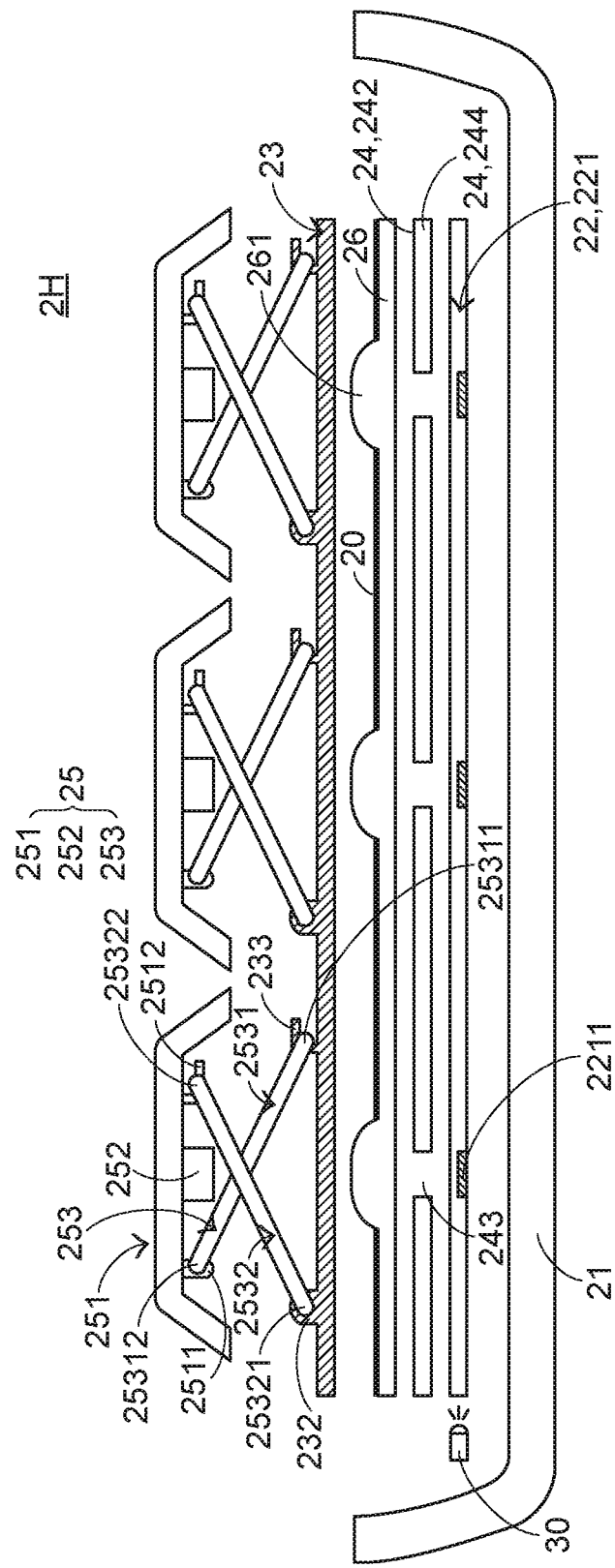
FIG. 19 is a schematic side view illustrating a luminous keyboard according to a ninth embodiment of the present invention.

FIG. 19 is a schematic side view illustrating a luminous keyboard according to a ninth embodiment of the present invention. Except for the following items, the other components of the luminous keyboard 2H of this embodiment are similar to those of the luminous keyboard of the third embodiment, and are not redundantly described herein. In comparison with the third embodiment, a light-shading structure 20 (e.g. a light-shading ink layer) is formed on an outer surface of the light-transmissible substrate 26. Consequently, the portion of the light beam scattered upwardly by the light-guiding dot 2211 fails to be transmitted through the light-shading structure 20, but the light beam is only transmissible through the portion of the light-transmissible substrate 26 which is not shaded by the light-shading structure 20. Due to the light-shading structure 20, the light beam fails to be leaked to any place where the light beam is not needed. In this embodiment, the light-shading structure 20 is formed on the outer surface of the light-transmissible substrate 26. The luminous keyboard is presented herein for purpose of illustration and description only. It is noted that numerous modifications and alterations may be made while retaining the teachings of the invention. For example, in some other embodiments, the light-shading structure 20 may be formed on an inner surface of the light-transmissible substrate 26.

However, those skilled in the art will readily observe that the light-shading structure 20 of the ninth embodiment may be applied to all of the above embodiments while retaining the teachings of the ninth embodiment of the present invention. That is, in all of the above embodiments, the light-shading structure 20 may be formed on the surface of the light-transmissible substrate 26. Consequently, the portion of the light beam scattered upwardly by the light-guiding dot 2211 fails to be leaked to any place where the light beam is not needed.

In the above embodiments, the sensing circuit pattern is arranged between the light guide panel and the light-transmissible supporting plate, but is not limited thereto. That is, the position of the sensing circuit pattern is not restricted as long as the sensing circuit pattern can generate the non-contact key signal in response to the downward movement of the depressed key. For example, in some embodiments, the sensing circuit board or the sensing membrane wiring board may be disposed under the light guide panel.

From the above descriptions, the present invention provides a luminous keyboard. In the luminous keyboard, a light-transmissible substrate with plural light diffusion structures is disposed over a light guide panel. By the plural light diffusion structures, the portion of the light beam scattered upwardly by the light guide panel can be effectively refracted to the light-outputting region of the keycap. Moreover, by the light-shading structure, the light beam will not be leaked to any place where the light beam is not needed. Consequently, the light utilization efficiency is enhanced. In comparison with the conventional non-sensing keyboard without the illuminating function, the luminous keyboard of the present invention has industrial applicability.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A luminous keyboard, comprising:
   a sensing membrane wiring board comprising a sensing circuit pattern formed on said sensing membrane wiring board for generating at least one non-contact key signal;
   at least one key, wherein when said at least one key is depressed, said at least one non-contact key signal is correspondingly generated by said sensing circuit pattern;
   a lateral-emitting type illumination element for providing a light beam;
   a light guide panel, wherein said lateral-emitting type illumination element is located at a lateral side of said light guide panel, and said light guide panel has at least one light-guiding dot for collecting and scattering said light beam from said lateral-emitting type illumination element;
   a supporting plate for connecting and supporting said at least one key, wherein said supporting plate has at least one light-transmissible part corresponding to said at least one key; and a light-transmissible substrate arranged between said supporting plate and said light guide panel, wherein said light-transmissible substrate comprises at least one light diffusion structure corresponding to said at least one key for changing an optical path of said light beam from said at least one light-guiding dot, so that said light beam from said at least one light-guiding dot is sequentially transmitted through said at least one light diffusion structure and said at least one light-transmissible part and then directed to said at least one key;

wherein said sensing membrane wiring board is arranged between said light guide panel and said supporting plate;

wherein said at least one light diffusion structure comprises plural microstructures, and said plural microstructures are formed on said light-transmissible substrate; or wherein said at least one light diffusion structure is at least one lens, and said at least one lens is formed on said light-transmissible substrate; or wherein said at least one light diffusion structure has a lens profile, and said at least one light diffusion structure is integrally formed with said light-transmissible substrate.

2. The luminous keyboard according to claim 1, wherein said sensing membrane wiring board has at least one perforation corresponding to said at least one light diffusion structure and wherein said light beam from said at least one light-guiding dot is sequentially transmitted through said at least one perforation, said at least one light diffusion structure, said at least one light-transmissible part and then directed to said at least one key.

3. The luminous keyboard according to claim 1, wherein said sensing membrane wiring board is made of polyethylene terephthalate (PET), polycarbonate (PC), thermoplastic polyurethane (TPU) or polymethylmethacrylate (PMMA).

4. The luminous keyboard according to claim 1, wherein said sensing circuit pattern comprises at least one first electrode pattern and at least one second electrode pattern, wherein when said sensing circuit pattern is electrically conducted, an electric field between said at least one first electrode pattern and said at least one second electrode pattern is generated, wherein as said at least one key is depressed and moved toward said sensing circuit pattern, said electric field is changed, so that said at least one non-contact key signal is correspondingly generated by said sensing circuit pattern.

5. The luminous keyboard according to claim 1, wherein said at least one key comprises:

a keycap exposed outside said luminous keyboard; and a conductive element arranged between said keycap and said sensing circuit pattern, and movable with said keycap, wherein as said keycap is depressed, said conductive element is moved downwardly toward said sensing circuit pattern, so that said at least one non-contact key signal is correspondingly generated by said sensing circuit pattern.

6. The luminous keyboard according to claim 5, wherein said conductive element is made of conductive foam, metallic material or metallic paint.

7. The luminous keyboard according to claim 5, wherein said at least one key further comprises a connecting element, and said connecting element is connected between said supporting plate and said keycap, so that said keycap is movable upwardly or downwardly relative to said supporting plate; or wherein said at least one key further comprises plural elastic arms for allowing said keycap to be moved upwardly or downwardly relative to said sensing circuit pattern, wherein each of said plural elastic arm comprises a fixed end connected with said supporting plate and a free end connected with said keycap; or wherein said at least one key further comprises:

a key frame comprising a hollow portion, wherein said keycap is embedded into said hollow portion of said key frame; and plural elastic arms for allowing said keycap to be movable upwardly or downwardly relative to said sensing circuit pattern, wherein each of said plural elastic arms comprises a static inner arm part, a movable outer arm part and an angular transition part, wherein said angular transition part is connected between said static inner arm part and said movable outer arm part.

8. The luminous keyboard according to claim 1, wherein each of said plural microstructures is a V-cut structure or a texturing structure.

9. The luminous keyboard according to claim 1, further comprising at least one of a metallic bottom plate and a reflective layer, wherein said metallic bottom plate is disposed under said sensing circuit pattern, wherein said reflective layer is disposed under said light guide panel, and said light beam from said light guide panel is reflected by said reflective layer.

10. The luminous keyboard according to claim 1, wherein said lateral-emitting type illumination element is a light emitting diode.

11. The luminous keyboard according to claim 1, wherein said luminous keyboard is a capacitive sensing luminous keyboard.

12. The luminous keyboard according to claim 1, wherein said supporting plate is a light-transmissible supporting plate.

13. The luminous keyboard according to claim 1, further comprising a light-shading structure, wherein said light-shading structure is formed on a surface of said light-transmissible substrate.

14. The luminous keyboard according to claim 1, wherein said light-shading structure is a light-shading ink layer.

15. The luminous keyboard according to claim 1, wherein said at least one light-transmissible part is an opening of said supporting plate.

* * * * *